(12) United States Patent
Yoshida et al.

(10) Patent No.: US 11,594,519 B2
(45) Date of Patent: Feb. 28, 2023

(54) SEMICONDUCTOR DEVICE

(71) Applicant: SONY SEMICONDUCTOR SOLUTIONS CORPORATION, Kanagawa (JP)

(72) Inventors: Naruhiro Yoshida, Tokyo (JP); Takuya Kimoto, Kanagawa (JP); Seiichiro Fukai, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/770,786

(22) PCT Filed: Oct. 5, 2018

(86) PCT No.: PCT/JP2018/037389
§ 371 (c)(1),
(2) Date: Jun. 8, 2020

(87) PCT Pub. No.: WO2019/123777
PCT Pub. Date: Jun. 27, 2019

(65) Prior Publication Data
US 2020/0388593 A1 Dec. 10, 2020

(30) Foreign Application Priority Data

Dec. 20, 2017 (JP) .............................. JP2017-244239

(51) Int. Cl.
*H01L 25/065* (2006.01)
*H01L 23/552* (2006.01)
*H03B 5/12* (2006.01)

(52) U.S. Cl.
CPC ........ *H01L 25/0657* (2013.01); *H01L 23/552* (2013.01); *H03B 5/12* (2013.01);
(Continued)

(58) Field of Classification Search
CPC ............. H03L 7/06–235; H01L 25/043; H01L 25/0657; H01L 25/074; H01L 25/0756;
(Continued)

(56) References Cited

U.S. PATENT DOCUMENTS 9,520,356 B1 * 12/2016 Chiesa .............. H01L 23/49827
2005/0184378 A1 8/2005 Sasaki
(Continued)

FOREIGN PATENT DOCUMENTS

JP 2005-039596 A 2/2005
JP 2005-243754 A 9/2005
(Continued)

OTHER PUBLICATIONS

International Search Report and Written Opinion of PCT Application No. PCT/JP2018/037389, dated Nov. 27, 2018, 12 pages of ISRWO.

*Primary Examiner* — Victor A Mandala
*Assistant Examiner* — Lawrence C Tynes, Jr.
(74) *Attorney, Agent, or Firm* — Chip Law Group

(57) ABSTRACT

A semiconductor device includes a plurality of semiconductor chips disposed in a vertical form through a spacer, in which a shield layer having a thickness such that an electromagnetic field radiation generated from a generation source of the semiconductor chip can sufficiently be absorbed is disposed between the semiconductor chips.

7 Claims, 3 Drawing Sheets

(52) U.S. Cl.
CPC ............... *H01L 2225/0651* (2013.01); *H01L 2225/06537* (2013.01); *H01L 2225/06575* (2013.01)

(58) Field of Classification Search
CPC ..... H01L 25/117; H01L 23/552; H01L 24/73; H01L 2225/06537; H01L 2225/06503–06596; H01L 2225/06506–06551; H01L 2225/1041–107; H01L 2924/3025
See application file for complete search history.

(56) References Cited

U.S. PATENT DOCUMENTS

| | | | | |
|---|---|---|---|---|
| 2007/0296087 | A1* | 12/2007 | Ogata | ................... H01L 23/552 257/778 |
| 2010/0213585 | A1* | 8/2010 | Usami | ................ H01L 25/0657 257/660 |
| 2012/0126379 | A1* | 5/2012 | Uenda | .................... H01L 24/27 156/60 |
| 2017/0324388 | A1* | 11/2017 | Soliman | ................... H03G 3/20 |

FOREIGN PATENT DOCUMENTS

| | | |
|---|---|---|
| JP | 2007-227414 A | 9/2007 |
| JP | 2010-199286 A | 9/2010 |
| WO | 2017/122416 A1 | 7/2017 |

\* cited by examiner

SEMICONDUCTOR DEVICE

CROSS REFERENCE TO RELATED APPLICATIONS

This application is a U.S. National Phase of International Patent Application No. PCT/JP2018/037389 filed on Oct. 5, 2018, which claims priority benefit of Japanese Patent Application No. JP 2017-244239 filed in the Japan Patent Office on Dec. 20, 2017. Each of the above-referenced applications is hereby incorporated herein by reference in its entirety.

TECHNICAL FIELD

The present technology relates to a semiconductor device applicable, for example, to a tuner that receives television broadcasting.

BACKGROUND ART

In the case of a semiconductor device in which a plurality of semiconductor chips is mounted in one package, a configuration in which the plurality of semiconductor chips is disposed in the state of being aligned horizontally is adopted. In such a conventional semiconductor device, there is a problem that an area of the semiconductor device is large. In addition, in a semiconductor device in which a plurality of semiconductor chips is disposed in the state of being stacked in the vertical direction, there is a problem that deterioration of the characteristics of the semiconductor chips is generated under an influence of electromagnetic field interference between the semiconductor chips attendant on the close disposition of the upper and lower semiconductor chips.

For example, in the case of a tuner device used for reception of television broadcasting (terrestrial broadcasting, satellite broadcasting, cable television, etc.), a PLL circuit includes an LC resonance type oscillation circuit. For example, for diversity reception, two tuner sections are used. In the case where two semiconductor chips stacked vertically constitute respective tuner sections, the positions where a coil of an LC resonance type oscillation circuit on each semiconductor chip are the same. Therefore, a magnetic flux generated from the coil of the oscillator on one side intersects the coil on the other side, resulting in a problem that the oscillation frequency of the oscillator on the other side fluctuates.

In addition, in PTL 1 described below, a technology in which two or more layers of spacers different in area are interposed between semiconductor chips is proposed as a technology for avoiding flexure in a semiconductor stacked package.

CITATION LIST

Patent Literature

[PTL 1]
JP 2005-243754A

SUMMARY

Technical Problems

The technology described in PTL 1 is mainly intended for prevention of flexure and suppression of void, and is not one for restraining electromagnetic coupling between the upper and lower semiconductor chips mentioned above. PTL 1 has a problem in that in the case where, for example, a metallic film is small in thickness or the frequency of a noise source is low, a sufficient absorption loss of noise may not be obtainable in the metallic film, and a sufficient noise restraining effect may not be obtainable. In addition, the metallic film is not electrically grounded to earth, and the shield effect is limitative.

Accordingly, it is an object of the present technology to provide a semiconductor device in which semiconductor chips are stacked vertically and which is not influenced by mutual electromagnetic field interference.

Solution to Problems

In order to solve the aforementioned problems, the present technology provides a semiconductor device including a plurality of semiconductor chips disposed in a vertical form through a spacer, in which a shield layer having a thickness such that an electromagnetic field radiation generated from a generation source of the semiconductor chip can sufficiently be absorbed is disposed between the semiconductor chips.

Advantageous Effect of Invention

According to at least one embodiment, notwithstanding a simple structure, electromagnetic field interference between upper and lower semiconductor chips can be reduced, and it is possible to provide a small-type semiconductor device in which two or more semiconductor chips are stacked. Note that the effect described here is not necessarily limitative, and the effect may be any one of the effects described in the present technology or an effect different from them. In addition, the contents of the present technology are not to be construed as limited by the effects mentioned as examples in the following description.

DESCRIPTION OF EMBODIMENTS

The embodiments described below are preferred specific examples of the present technology, and technically preferable various limitations are attached thereto. However, the scope of the present technology is not limited to these embodiments, unless it is specified that the present technology is limited, in the following description.

Note that the description of the present technology will be made in the following order.

<1. Description of problem>
<2. First embodiment of the present technology>
<3. Second embodiment of the present technology>
<4. Third embodiment of the present technology>
<5. Fourth embodiment of the present technology>
<6. Application example>
<7. Modification>

1. Description of Problem

Figure 7:
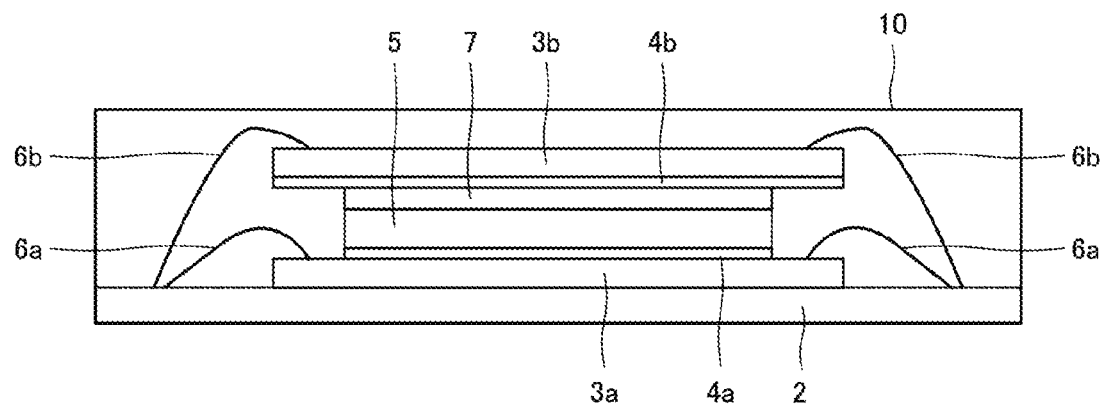
FIG. 7 is a sectional view used for explanation of a conventional semiconductor device.

Prior to the description of the present technology, problems in the conventional semiconductor device will be described. A conventional semiconductor device 11A depicted in FIG. 7 includes two semiconductor chips 13a and 13b of the same configuration disposed on a common substrate 12. The semiconductor chips 13a and 13b include various circuits (integrated circuits ICs) such as an oscillator, an amplifier, a memory, and a logic. As illustrated in FIG. 7, a configuration in which the semiconductor chips 13a and 13b are disposed on a planar basis has a problem in that a shape (area) of the semiconductor device 11A is large.

Figure 8:
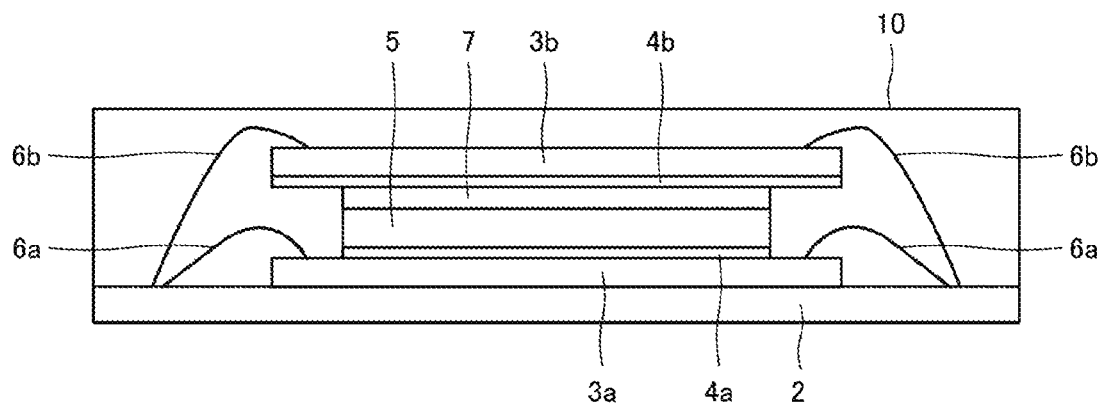
FIG. 8 is a schematic diagram used for explanation of problems in the conventional semiconductor device.

A conventional semiconductor device 11B in which semiconductor chips 13a and 13b are disposed in the state of being stacked in the vertical direction as depicted in FIG. 8 has been known. The semiconductor chip 13a is disposed on a substrate 12, and a spacer 15 is adhered onto the semiconductor chip 13a by an adhesive 14a. The semiconductor chip 13b is adhered onto the spacer 15 by an adhesive 14b. The semiconductor chip 13a and the substrate 12 are connected to each other by wires 16a, and the semiconductor chip 13b and the substrate 12 are connected to each other by wires 16b.

Figure 9:
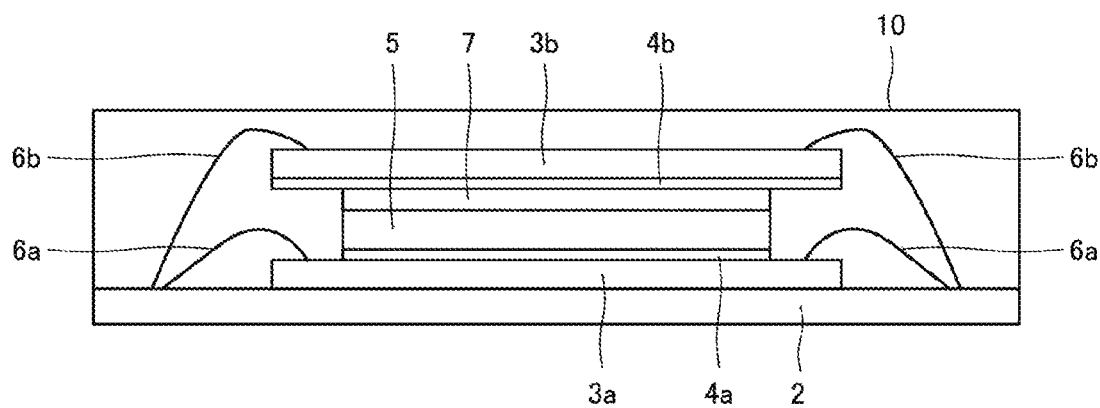
FIG. 9 is a sectional view depicting another example of the conventional semiconductor device.

FIG. 9 depicts a schematic diagram of mutual interference due to magnetic field radiation generated by the circuit. A position of an inductor 21a of an LC resonance type oscillator included in the semiconductor chip 13a and a position of an inductor 21b of an LC resonance type oscillator included in the semiconductor chip 13b are substantially coincident. An AC current 22a flows through the inductor 21a, and a magnetic flux 23 is generated by the AC current 22a. An AC current 22b may be generated by passing of the magnetic flux 23 through the inductor 21b, which may adversely affect the operation of the oscillator of the semiconductor chip 13b. The present technology solves such a problem.

2. First Embodiment of the Present Technology

Figure 1:
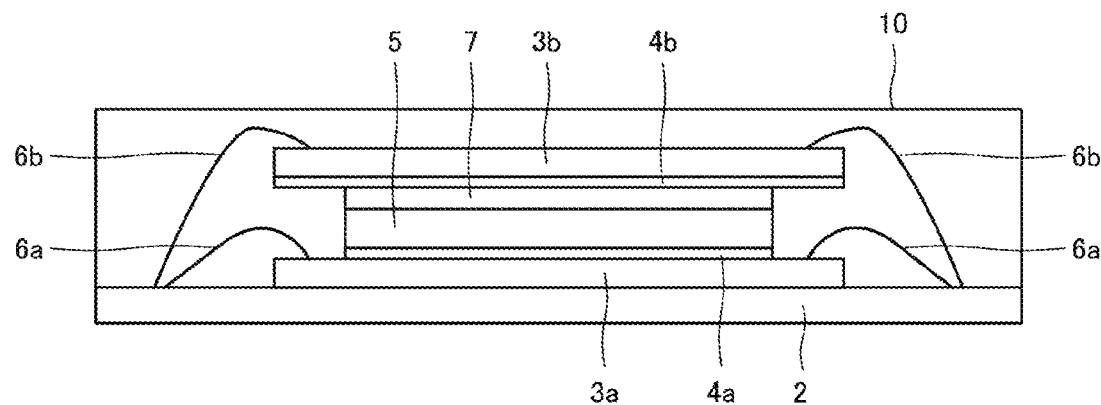
FIG. 1 is a sectional view of a first embodiment of the present technology.

FIG. 1 is a sectional view of a semiconductor device 10 according to a first embodiment. A semiconductor chip 3a is fixed on a substrate 2 by an adhesive, a silver paste or the like. The semiconductor 3a includes various circuits such as an oscillator, an amplifier, a memory, and a logic, and constitutes, for example, a tuner section of a television reception device. This applies also to a semiconductor chip 3b. Note that the respective semiconductor chips 3a and 3b are not limited to the configuration in which they include a plurality of ICs or chip parts, and a configuration in which these functions are incorporated on a single chip (SoC (System on a Chip)) may also be adopted.

A spacer 5 is fixed on an upper surface of the semiconductor chip 3a through an adhesive 4a. The spacer 5 includes, for example, a chip obtained by dicing a silicon wafer. A first purpose of providing the spacer 5 is to secure a space for connecting a wire 6a of the substrate 2 to the semiconductor chip 3a. Therefore, an area of the spacer 5 is set smaller than that of the semiconductor chip 3a.

A second purpose of disposing the spacer 5 is to secure insulating property such that in the case, for example, where the semiconductor chip 3a has an analog circuit or a high-speed logic circuit such as an oscillator or amplifier and a comparatively low-resistance substrate is used for the semiconductor chip 3b, the configuration does not influence the operation of the circuit (for example, an LC circuit) of the semiconductor chip 3a. Therefore, the spacer 5 should be sufficiently higher in resistance than the substrate of the semiconductor chip 3a and have a sufficient thickness. In the first embodiment, a silicon chip having a specific resistance of 100 Ω·cm and a thickness of 200 μm is used as the spacer 5. In addition, silicon nitride ($Si_3N_4$) having a specific resistance of greater than $10^{14}$ Ω·cm, silicon carbide (SiC) having a specific resistance of $10^5$ Ω·cm, alumina ($Al_2O_3$) having a specific resistance of greater than $10^{14}$ Ω·cm, zirconia ($ZrO_2$) having a specific resistance of greater than $10^{13}$ Ω·cm, and aluminum nitride (AlN) having a specific resistance of greater than $10^{14}$ Ω·cm may also be applicable to the spacer, similarly to the aforementioned silicon.

A shield layer 7 is formed on an upper surface of the spacer 5. A semiconductor chip 3b is fixed on an upper surface of the shield layer 7 by an adhesive 4b. The shield layer 7 has a purpose of shielding a magnetic flux generated by an inductor of the semiconductor chip 3a. The adhesives 4a and 4b should include an insulating material, similarly to the spacer 5. For example, the adhesives 4a and 4b may be a thin tape having a pressure sensitive adhesive property on both sides thereof. Specifically, an epoxy-based adhesive was used as the adhesives 4a and 4b. A silicone-based adhesive, a phenolic adhesive, and a cyanoacrylic one may also be applied, similarly to the aforementioned adhesive.

As one example, the shield layer 7 is an aluminum thin film formed by sputtering aluminum on the spacer 5. A similar effect can be obtained with a metal with which a high conductivity on the same order of that of aluminum can be obtained. The shield layer 7 may not necessarily be grounded. Other than a reflection loss of an electromagnetic field due to a difference in impedance between a peripheral dielectric material (in the present embodiment, silicon of the spacer 5) and the shield material (in the present embodiment, the shield layer 7 of aluminum), particularly in the case where the frequency of the electromagnetic field is a high frequency band of several gigahertz, an absorption loss in the shield layer 7 can be expected even where the thickness of the shield layer 7 is on the order of several micrometers. Further, a metallic thin film can be produced by sputtering each of copper (Cu), nickel (Ni), gold (Au), and silver (Ag) on the spacer 5. In addition, with the aforementioned metallic material formed by a vacuum deposition method, a thin film can be produced and a similar effect can be obtained.

Figure 2:
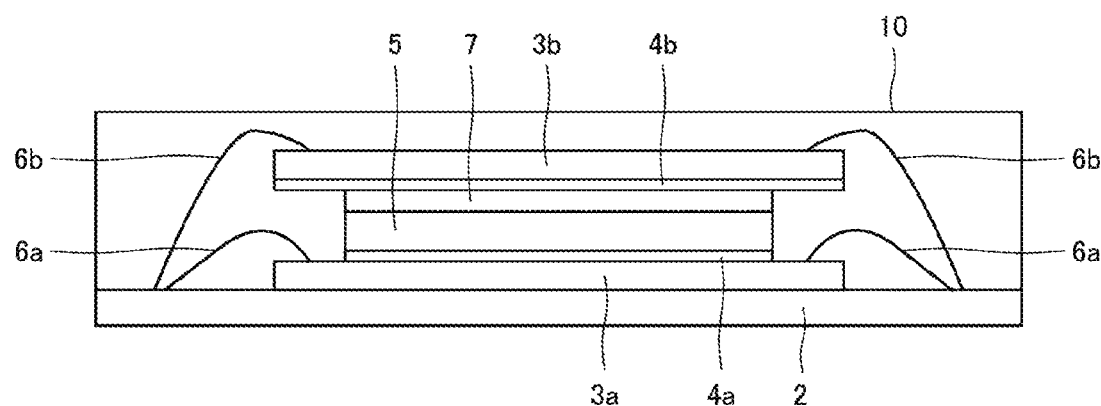
FIG. 2 is a schematic diagram used for explanation of a function of a shield layer.

It has been known that an eddy current that generates a magnetic field in the opposite direction flows in the shield layer 7 inserted in the form of shielding a magnetic field, as depicted in FIG. 2, and an absorption loss is generated. By this absorption of the electromagnetic wave, electromagnetic wave energy can be attenuated. With the electromagnetic wave attenuated, influences on an electronic apparatus and electronic devices is avoided. The absorption loss is represented by the following formula.

$$20 \text{long}\{e^{\gamma/\delta}\} \, [dB]$$

Here, δ is a skin depth, is determined by the material of the shield layer 7 and the frequency of the electromagnetic field, and is represented by the following formula.

$$\delta = \sqrt{(\pi \times \text{frequency} \times \text{conductivity} \times \text{permeability})} \ [m]$$

t is the thickness of the shield layer 7.

In an example in which aluminum is used as the shield layer 7, the skin depth δ when the frequency of the electromagnetic field is 1 GHz is 2.6 μm. Further, when (the thickness of the shield layer is t=2.6 μm), the calculated value of the absorption loss is 8.7 dB.

For example, in the case where the semiconductor chips 3a and 3b are both tuner sections for reception of television broadcasting, signals of similar frequencies of the television frequencies may be received by the two semiconductor chips 3a and 3b, so that electromagnetic fields having similar frequencies are radiated from the semiconductor chip 3a.

PLL (Phase Locked Loop) circuits are included in the semiconductor chips 3a and 3b, in which a coil sensitive to external electromagnetic fields and the like are included. In this case, it is preferable to design the spacer 5, the shield layer 7 and the like in such a manner that the total of the reflection loss and the absorption loss will be on the order of 50 dB. When the thickness of the shield layer 7 designed is set greater than the thickness t (2.6 μm) of the shield used for the calculated value (8.7 dB) of the aforementioned absorption loss, the electromagnetic field radiated from the inductor of the semiconductor chip 3a can be absorbed more. A similar effect to that of aluminum can also be obtained with copper (Cu), nickel (Ni), and silver (Ag).

The first embodiment of the present technology as aforementioned makes it possible to restrain the magnetic flux generated from the inductor provided in the semiconductor chip 3a from passing through the inductor provided in the semiconductor chip 3b, and to prevent adverse influences from being exerted on the operation of the oscillator of the semiconductor chip 3b.

3. Second Embodiment of the Present Technology

Figure 3:
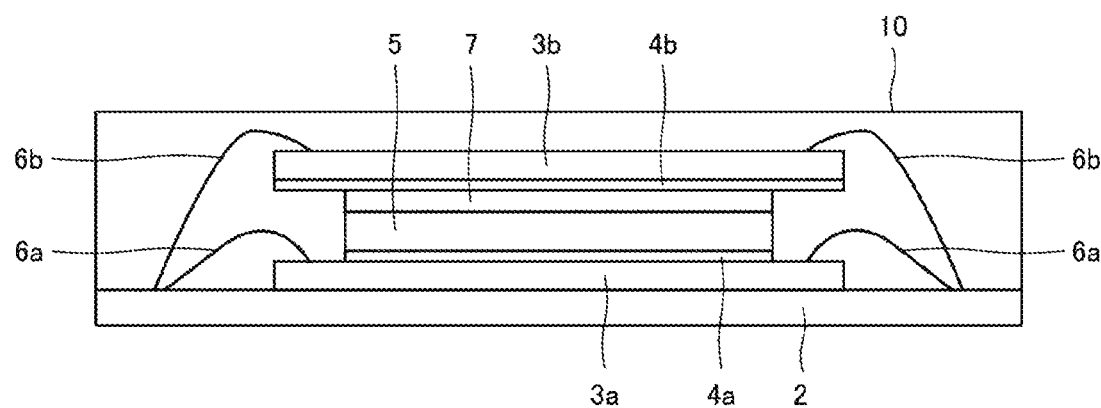
FIG. 3 is a sectional view of a second embodiment of the present technology.

FIG. 3 is a sectional view depicting a semiconductor device 20 according to a second embodiment of the present technology. In the second embodiment, the spacer 5 is not provided with a shield layer, and a conductive material is used as the adhesive 4b. With this configuration, a similar effect to that of the first embodiment is obtained. When the configurations other than the non-formation of the shied layer 7a and the characteristic properties of the adhesive 4b are set to be the same as those in the first embodiment aforementioned, an effect to attenuate the electromagnetic field radiated from the inductor of the semiconductor chip can be obtained. Specifically, the conductive adhesive used for electronic and electric uses is an organic-inorganic mixed material in which conductive particles such as metallic particulates such as those of aluminum (Al), copper (Cu), silver (Ag), and gold (Au) and metal-plated resin particles are uniformly dispersed in an organic binder such as an epoxy resin.

4. Third Embodiment of the Present Technology

Figure 4:
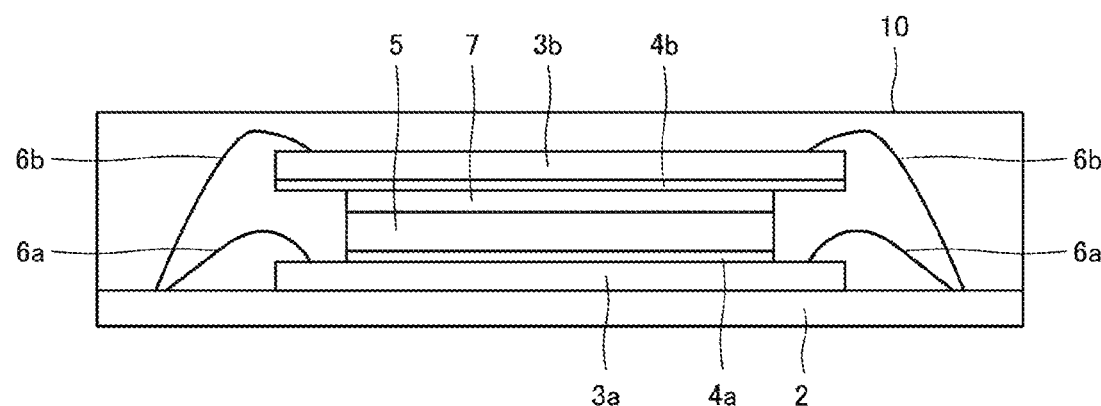
FIG. 4 is a sectional view of a third embodiment of the present technology.

FIG. 4 is a sectional view depicting a semiconductor device 30 according to a third embodiment of the present technology. The third embodiment is an embodiment in which the region of the shield layer 7 formed on an upper surface of the spacer 5 is limited. In the case where an aluminum layer having a wide area is formed as a shield layer, cracking of the aluminum layer called aluminum slide may be generated. In order to avoid the aluminum slide of the aluminum layer, the shield region of the shield layer 7 may be minimized, whereby an effect to attenuate the electromagnetic field radiated from the inductor of the semiconductor chip is obtained.

Specifically, the shield layer 7 is formed in the manner of being restricted to such a region (area and position) as to be able to cover interference source circuits (for example, an LC resonance type oscillator) of the semiconductor chips 3a and 3b. Since a radiation noise diffuses isotropically, the covering range of the shield layer 7 should cover a range of an area directly above the interference source circuits to an area reached by addition of the thickness of the spacer. When configurations other than the covering range of the shield layer 7 are set to be basically similar to those in the first embodiment, an effect to attenuate the electromagnetic field radiated from the inductor of the semiconductor chip is thereby obtained.

5. Fourth Embodiment of the Present Technology

Figure 5:
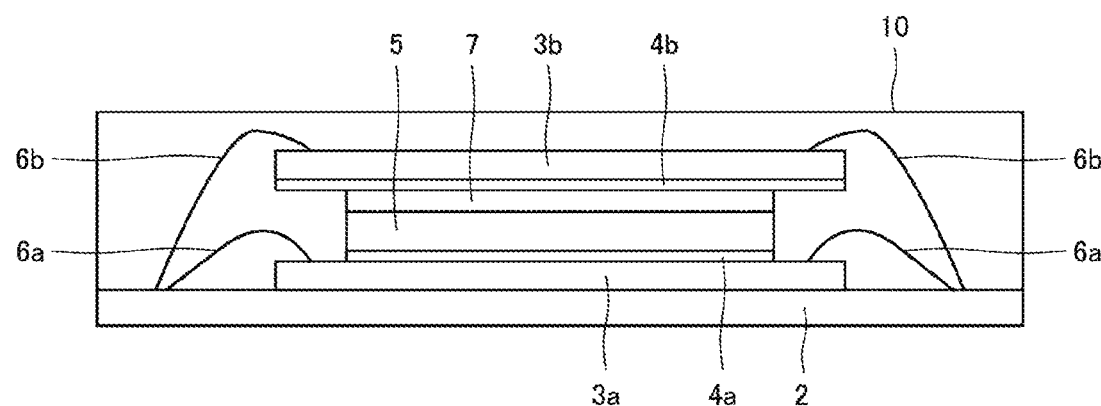
FIG. 5 is a sectional view of a fourth embodiment of the present technology.

FIG. 5 is a sectional view of a semiconductor device 40 according to a fourth embodiment of the present technology. In the fourth embodiment, the semiconductor chip 3a on the lower side is mounted by flip chip mounting, and wire connection between the substrate 2 and the semiconductor chip 3a is omitted. The flip chip mounting is one of methods for mounting a chip onto a mounting substrate, in which at the time of electrically connecting between the chip surface and the substrate, connection by wires like wire bonding is not adopted, but connection is conducted by projection-shaped terminals called bumps arranged in an array, which has a merit that the mounting area can be reduced as compared to the wire bonding. When other configurations than the mounting method of the semiconductor chip 3a are set to be basically similar to those in the first embodiment, an effect to attenuate the electromagnetic field radiated from the inductor of the semiconductor chip is thereby obtained.

6. Application Example

The semiconductor devices described as the first to fourth embodiments above are applicable, for example, as a tuner section of a reception device for receiving digital terrestrial television broadcasting or digital satellite broadcasting. As a configuration of a tuner section, there is diversity reception technology as one of effective countermeasures against phasing. An electromagnetic wave in communication undergoes reflection, diffraction, and scattering by being influenced by obstacles and reflectors such as buildings, trees, and ground undulations. As a result, a multiplicity of electromagnetic waves having passed through various routes interfere with one another, whereby the intensity of the electromagnetic wave is varied severely. This is called phasing. Diversity is a technology in which in regard of the same wireless signal received by a plurality of antennas, the signal of the antenna excellent in electromagnetic wave status is used preferentially, or the received signals are synthesized to remove noise, thereby to realize enhancement of quality and reliability of communication. Since an electromagnetic wave is reflected on impinging on an object, when a communicator is used near a large building, for example, there are an electromagnetic wave reaching the communicator directly and an electromagnetic wave reaching the communicator after reflection on the building, a difference in arrival time is generated (multi-pass) between the two electromagnetic waves, and the two electromagnetic waves interfere with each other, lowering the quality of communication. For preventing this, a technology of using two or more antennas to receive the plurality of electromagnetic waves and selecting the most intense electromagnetic wave or synthesizing the electromagnetic waves is called diversity. The diversity reception is a technology in which outputs of a plurality of reception systems obtained by disposing a plurality of antennas at spatially separated positions or by changing the direction or polarization are synthesized or switched, to thereby minimize level variations of the electromagnetic wave received. Examples of a synthetic method for output in the diversity reception system mainly include a maximum ratio synthetic reception method, a selection synthesis reception method, and an equal gain combining reception method.

Figure 6:
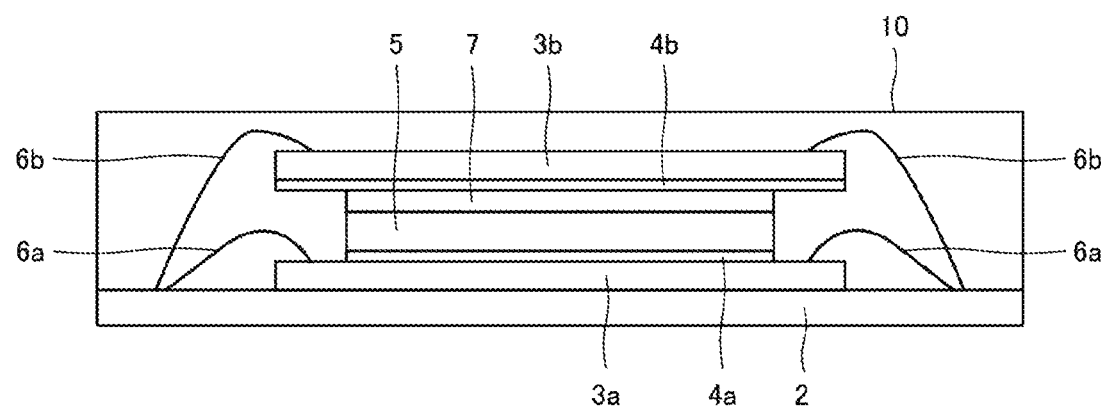
FIG. 6 is a block diagram of an application example of the present technology.

In a diversity reception technology, as depicted in FIG. 6, two antennas AT1 and AT2 are provided, and outputs of the antennas are supplied to tuner sections TU1 and TU2. The tuner section TU1 has an RF amplifier 31 for amplifying the output of the antenna AT1, a mixer 32, an oscillator 33, and an A/D converter 34. A reception channel is selected by the mixer 32 and the oscillator 33.

Similarly, the tuner section TU2 has an RF amplifier 41, a mixer 42, an oscillator 43, and an A/D converter 44. The tuner sections TU1 and TU2 are configured as semiconductor devices according to the present technology mentioned above. The oscillators 33 and 43 have the configuration of an LC oscillator, and have coils. In addition, the oscillators 33 and 43 constitute PLL. By adopting the semiconductor device of the present embodiment as aforementioned, an effect to attenuate the electromagnetic field radiated from the inductor of the semiconductor chip is obtained.

Outputs of the tuner sections TU1 and TU2 are supplied to a demodulation and diversity synthetic section 45, processing of OFDM demodulation and the like are conducted, and a transport stream is formed. Further, in the demodulation and diversity synthetic section 45, the outputs of the two tuner sections are respectively demodulated and thereafter synthesized. For example, a selector for selecting the outputs of the two antennas AT1 and AT2 is provided, and the output of the antenna on one side is selected by an antenna control signal formed in the demodulation and diversity synthetic section 45. Other than the selection processing, a processing for maximum ratio synthesis of the outputs of the two antennas AT1 and AT2 can also be performed.

7. Modification

While the embodiments of the present technology have been specifically described above, the present technology is not limited to the aforementioned embodiments, and various modifications are possible based on the technical thought of the present technology. In addition, the configurations, methods, steps, shapes, materials, numerical values and the like in the aforementioned embodiments may be combined with one another, unless departing from the gist of the present technology.

For example, an example in which a silicon chip is used as the spacer 5 has been described in the aforementioned embodiments, this is not limitative, and a similar effect can be obtained also by a configuration in which the spacer 5 includes a material having a high resistance and a low dielectric constant, for example, a glass epoxy substrate (FR-4) substrate. FR-4 is an abbreviation of (Flame Retardant Type 4), and means a blank material which is formed by impregnating a cloth of glass fibers with an epoxy resin, followed by a heat-curing treatment to obtain a plate-like body, and which has both flame retardant property and low conductivity. A substrate obtained by using a plate of FR4 as a base material and adhering a copper foil thereto is a "glass epoxy substrate," which is often used as a material of printed circuit board. In addition, a working example in which aluminum is used as the shield layer 7 has been described, this is not limitative, and a similar effect can be obtained also by use of a material capable of obtaining a conductivity on the order of that of aluminum, such as, for example, gold and copper.

Note that the present technology may take the following configurations.

(1)
A semiconductor device including:
a plurality of semiconductor chips disposed in a vertical form through a spacer, in which
a shield layer having a thickness such that an electromagnetic field radiation generated from a generation source of the semiconductor chip that is capable of sufficiently being absorbed is disposed between the semiconductor chips.

(2)
The semiconductor device according to (1), in which the shield layer has a region that corresponds to spreading of the electromagnetic field radiation due to layout of the generation source and the spacer.

(3)
The semiconductor device according to (2), in which the shield layer is formed in an area and at a position such as to be able to cover the generation source of the semiconductor chip, and a covering range of the shield layer covers a range of an area directly above the generation source to an area reached by addition of a thickness of the spacer.

(4)
The semiconductor device according to (1), in which the spacer includes any one of silicon, alumina, zirconia, and aluminum nitride.

(5)
The semiconductor device according to (1) to (4), in which the shield layer is a metallic thin film.

(6)
The semiconductor device according to (5), in which the metallic thin film of the shield layer includes any one of aluminum, copper, nickel, and silver.

(7)
The semiconductor device according to any one of (1) to (6), in which the generation source has an LC resonator including an inductor and a capacitor.

(8)
The semiconductor device according to any one of (1) to (7), in which the semiconductor chip has an oscillator in which the LC resonator is used.

(9)
The semiconductor device according to any one of (1) to (10), in which the semiconductor chip constitutes a television broadcasting receiving tuner.

REFERENCE SIGNS LIST 10, 20, 30, 40 . . . . Semiconductor device
2 . . . Substrate,
3a, 3b . . . . Semiconductor chip
4a, 4b . . . . Adhesive 5 . . . Spacer,
6a, 6b . . . . Wire
7 . . . . Shield layer.

The invention claimed is:

1. A semiconductor device, comprising:
a substrate;
a first semiconductor chip on an upper surface of the substrate, wherein
 the first semiconductor chip comprises a first generation source configured to generate first electromagnetic field radiation, and
 the first generation source is a first oscillator;
a spacer on the first semiconductor chip, wherein the spacer includes one of silicon, alumina, zirconia, or aluminum nitride;
a shield layer on an upper surface of the spacer, wherein
 the shield layer is a metallic thin film, and
 the shield layer is configured to absorb the first electromagnetic field radiation; and
a second semiconductor chip on an upper surface of the shield layer, wherein
 the second semiconductor chip comprises a second generation source configured to generate second electromagnetic field radiation,
 the second generation source is a second oscillator,
 each of the first oscillator and the second oscillator includes configuration of an LC oscillator, and
 each of the first oscillator and the second oscillator constitutes Phase Locked Loop (PLL).

2. The semiconductor device according to claim 1, wherein
 the shield layer has a region that corresponds to spread of the generated first electromagnetic field radiation due to layout of the first generation source and the spacer.

3. The semiconductor device according to claim 2, wherein
 the shield layer covers the first generation source of the first semiconductor chip, and
 the shield layer covers a range of an area that includes a first area that is directly above the first generation source and a second area reached by addition, of a thickness of the spacer, to the first area.

4. The semiconductor device according to claim 1, wherein the metallic thin film includes one of aluminum, copper, nickel, or silver.

5. The semiconductor device according to claim 1, wherein each of the first generation source and the second generation source has an LC resonator including an inductor and a capacitor.

6. The semiconductor device according to claim 1, wherein the first semiconductor chip constitutes a television broadcasting receiving tuner.

7. The semiconductor device according to claim 1, wherein the shield layer has a thickness greater than 2.6 micrometres (μm).

* * * * *